United States Patent [19]

Tanaka et al.

[11] Patent Number: 5,253,663
[45] Date of Patent: Oct. 19, 1993

[54] TRANSFER APPARATUS

[75] Inventors: Hiroshi Tanaka; Mitsuo Nishi, both of Kurume; Ryuichi Mizoguchi, Kumamoto; Yuuji Kamikawa, Uto, all of Japan

[73] Assignees: Tokyo Electron Limited, Tokyo; Tokyo Electron Saga Limited, Tosu, Japan

[21] Appl. No.: 935,400

[22] Filed: Aug. 26, 1992

[30] Foreign Application Priority Data

Aug. 26, 1991 [JP] Japan .................................. 3-236816
Sep. 4, 1991 [JP] Japan .................................. 3-250224

[51] Int. Cl.$^5$ ................................................ B08B 3/02
[52] U.S. Cl. .................................. 134/95.2; 134/95.3; 134/103.3; 134/104.1; 134/902
[58] Field of Search ................. 134/902, 95.2, 95.3, 134/103.3, 104.1

[56] References Cited

U.S. PATENT DOCUMENTS 4,282,825  8/1981  Nagatomo et al. ............. 134/902 X
4,519,846  5/1985  Aigo ................................ 134/902 X
4,712,573 12/1987  Kuhl ............................... 134/95.2
4,936,328  6/1990  Yatabe ........................... 134/902 X Primary Examiner—Philip R. Coe
Attorney, Agent, or Firm—Oblon, Spivak, McClelland, Maier & Neustadt

[57] ABSTRACT

A rotary transfer arm for transferring semiconductor wafers is disposed in a closed housing. A closable opening portion is formed in the housing, through which the transfer arm can extend out from the housing. A fork is disposed at the distal end of the transfer arm. A plurality of holding grooves are formed in the fork to set a plurality of wafers with predetermined intervals between them. A cleaner for the fork is disposed in the upper portion of the housing. The cleaner has cleaning and drying nozzles mounted at the distal end of a switch arm. The switch arm can pivot between an operation position and a standby position. The switch arm can also move the cleaning and drying nozzles along the fork. During cleaning and drying, pure water is sprayed from the cleaning nozzles against the fork, and a drying gas is sprayed from the drying nozzles against it.

7 Claims, 15 Drawing Sheets

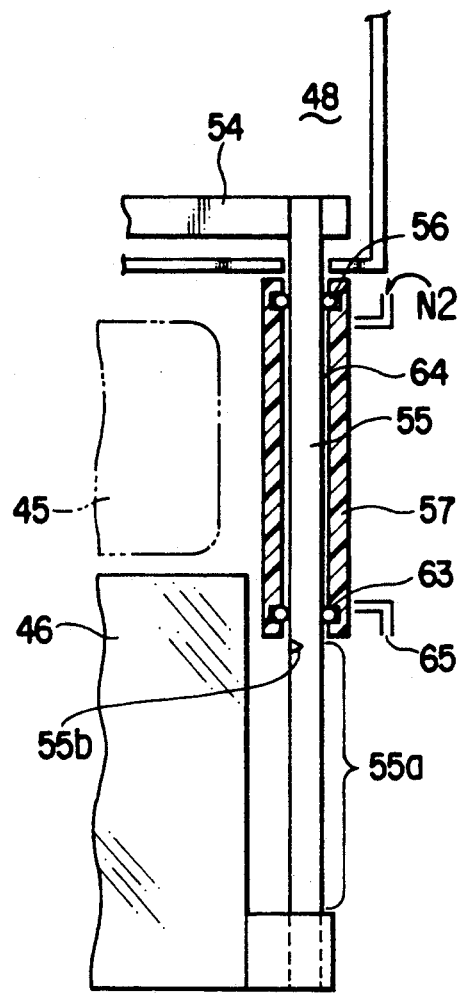
F I G. 5
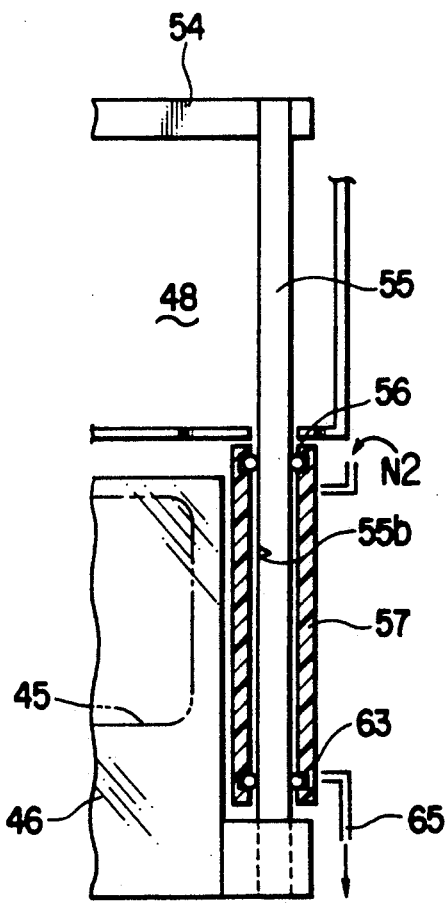
F I G. 6

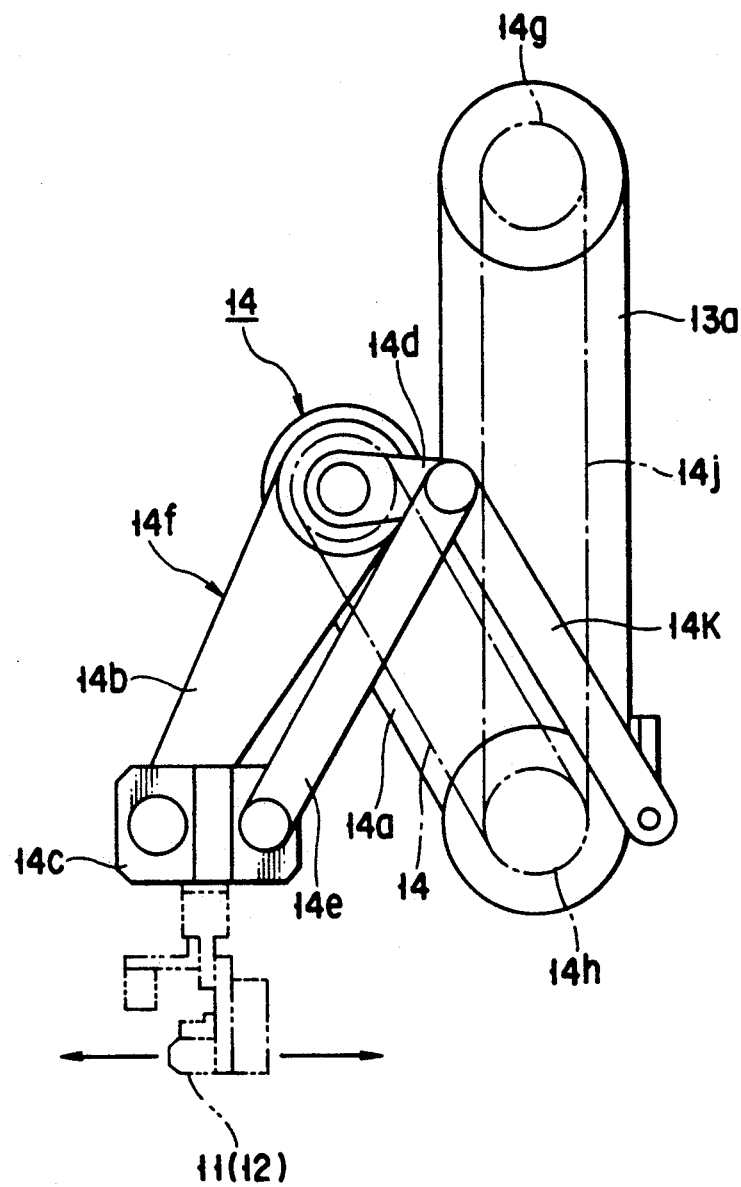
F I G. 12

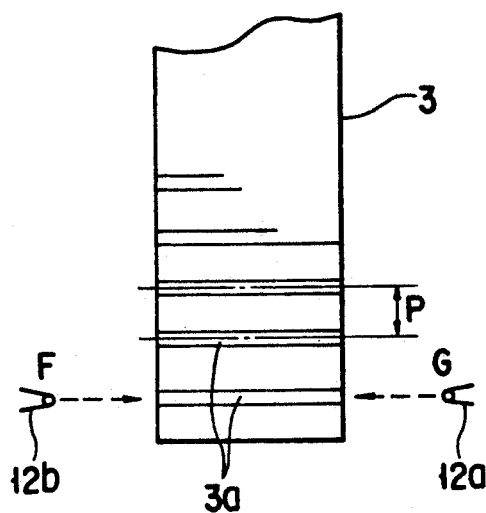
F I G. 17
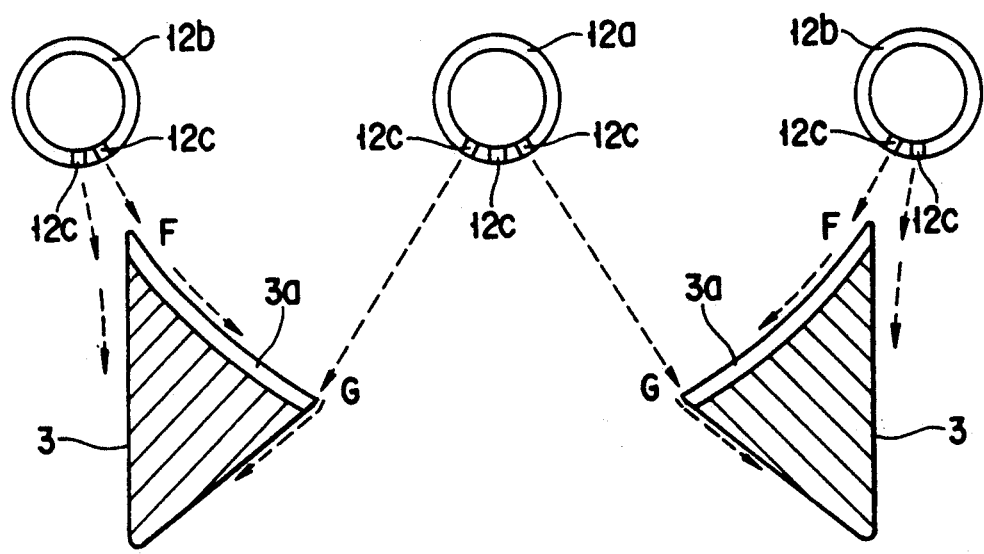
F I G. 18

TRANSFER APPARATUS

BACKGROUND OF THE INVENTION

1. Field of the Invention

The present invention relates to a transfer apparatus and, more particularly, to a transfer apparatus capable of cleaning and drying a wafer transfer means in an isolated space in a treatment system such as a semiconductor wafer cleaning system.

2. Description of the Related Art

In a semiconductor manufacturing process, a cleaning system is used to remove chemicals or impurities adhered to the surfaces of semiconductor wafers. In the cleaning system, a plurality of cleaning chambers each for accommodating a treatment bath, such as an ammonia treatment bath, a washing bath, or a hydrofluoric acid treatment bath, are arranged. Wafers as objects to be treated are placed on and held by a transfer means and transferred to or from each treatment chamber by the transfer means.

In the cleaning system, a cleaner is used as a means for removing treatment solutions or dust adhered to the transfer means. The cleaner removes treatment solutions or dust adhered to the transfer means and dries the transfer means by using cleaning nozzles and drying nozzles, respectively. This cleaner is generally constituted such that large numbers of cleaning nozzles and drying nozzles are arranged on a pipe having a length corresponding to the total length of the transfer means so that a portion, for holding objects to be treated, of the transfer means is entirely cleaned and dried at one time.

In this structure, however, since cleaning and drying are performed with the fixed cleaning nozzles and drying nozzles, a cleaning solution and a drying gas are sprayed from a large number of nozzles at the same time. Therefore, not only large quantities of the cleaning solution and the drying gas are consumed, but also the size of the cleaner is increased because a space occupied by the nozzles is large. In addition, it is complicated to manufacture a cleaner in which cleaning nozzles and drying nozzles are arranged throughout the total length of the transfer means, and it is also difficult to obtain a uniform spraying condition.

In the cleaning system, in order to prevent a leakage of an internal atmosphere to the outside, each treatment bath and the cleaner are surrounded by a housing. The housing has an opening portion through which wafers are transferred in and out. The opening portion is closed by a shutter so that the atmosphere inside the housing does not leak out of it. A drive unit for the shutter is generally located below the opening portion.

In this structure, however, wafers are transferred to and from treatment chambers having different atmospheres by the transfer means. Therefore, a chemical having adhered to the wafers or the transfer means in a pretreatment may drop into the opening portion or on the shutter during transfer. In addition, the chemical dropped inside the opening portion enters the shutter drive unit through a sealing portion and corrodes the drive unit.

Furthermore, dust produced in the shutter drive unit adheres to the sealing portion and sometimes enters the opening portion to contaminate wafers. This decreases the product yield of wafers.

SUMMARY OF THE INVENTION

It is, therefore, an object of the present invention to provide a transfer apparatus having a cleaner capable of uniformly cleaning and drying a transfer means with small quantities of a cleaning solution and a drying gas.

It is another object of the present invention to provide a transfer apparatus capable of preventing corrosion of a drive unit for a shutter means caused by a chemical dropping into an opening portion during transfer of objects to be treated and capable of preventing contamination of the objects to be treated caused by dust leaking from the drive unit into the opening portion.

According to the first aspect of the present invention, there is provided an apparatus for transferring a plurality of wafer-like objects to be treated, comprising:

a housing for defining a closed space;

an opening portion formed in the housing;

a transfer arm disposed in the housing, the arm comprising a movable portion capable of extending out from the housing through the opening portion;

a holding portion, disposed in the movable portion of the arm, for holding the objects to be treated, the holding portion having a plurality of holding grooves for arranging the objects to be treated with predetermined intervals therebetween;

opening/closing means for airtightly opening/closing the opening portion;

cleaning means, disposed in the housing, for spraying a cleaning solution against the holding portion;

drying means, disposed in the housing, for spraying a drying gas against the holding portion;

a support member for supporting the cleaning means and the drying means;

position switching means for moving the support member between an operation position and a standby position; and moving means for moving the support member along the holding portion in a direction perpendicular to the holding grooves.

Although the position switching means may extend/contract or slide the support member linearly, position switching is preferably performed by a pivotal motion. For example, the position switching means may be a structure in which a switch arm having a pivotally mounted proximal end and a distal end supporting cleaning and drying nozzles is pivoted by a motor.

The moving means is preferably interlocked with the position switching means. For example, this mechanism may be realized by a four-node rotational chain link mechanism which is connected to the free end of a position switch arm and driven by a drive source of the position switch arm to move the support member along the holding portion of the transfer arm.

The transfer apparatus according to the first aspect of the present invention can provide the following advantages.

1) Since the cleaning and drying means can be selectively moved between the operation position and the standby position, a space occupied by the apparatus can be reduced. This also prevents a transfer operation of the transfer arm from being interfered. In addition, a treatment is performed while the cleaning and drying means are moved along the transfer arm. Therefore, not only the size of the structure of the cleaning and drying means can be decreased, but also the consumption quantities of a cleaning solution and a drying gas can be reduced, and this reduces an operating cost.

2) Since cleaning and drying can be performed along the object holding grooves of the transfer arm, the cleaning and drying can be performed uniformly. Also, the efficiency of the cleaning and drying can be improved.

3) When a heating means for drying is used, it is possible to further improve the uniformity of drying and to increase the drying rate.

According to the second aspect of the present invention, there is provided an apparatus for transferring an object to be treated, comprising:

a housing for defining a first closed space;

an opening portion formed in the housing;

a transfer arm disposed in the housing, the arm comprising a movable portion capable of extending out from the housing through the opening portion;

a holding portion, disposed in the movable portion of the arm, for holding the object to be treated;

a shutter for airtightly opening/closing the opening portion;

means for defining a second space located above the opening portion and isolated from the first space;

driving means for driving the shutter contained in the second space;

cleaning means, disposed in the housing, for spraying a cleaning solution against the holding portion;

drying means, disposed in the housing, for spraying a drying gas against the holding portion;

a support member for supporting the cleaning means and the drying means; and position switching means for moving the support member between an operation position and a standby position.

The transfer apparatus according to the second aspect of the present invention can provide the following advantages.

1) Chemical droplets falling into the opening portion during transfer of the object to be treated are prevented from entering the driving means of the shutter. This prevents corrosion of the driving means.

2) When guide shafts for coupling the shutter with the driving means are surrounded by guide shaft receivers, it is possible to prevent dust adhered to the guide shafts or the outer atmosphere from adhering to the object to be treated.

3) When the interior of each guide shaft receiver is forcibly ventilated by a pressure gas, dust or the outer atmosphere adhered to the guide shaft can be aggressively exhausted out from an exhaust hole by the pressure gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 5 is a view for explaining a condition in which the shutter is open;

FIG. 6 is a view for explaining a condition in which the shutter is closed;

FIG. 12 is a schematic side view showing another operating condition of the cleaner;

FIG. 17 is a schematic plan view showing an operating condition of the drying nozzles of the cleaner; and FIG. 18 is a schematic side view showing the operating condition of the drying nozzles of the cleaner.

DETAILED DESCRIPTION OF THE PREFERRED EMBODIMENTS

An embodiment of the present invention will be described in detail below with reference to the accompanying drawings.

Figure 1:
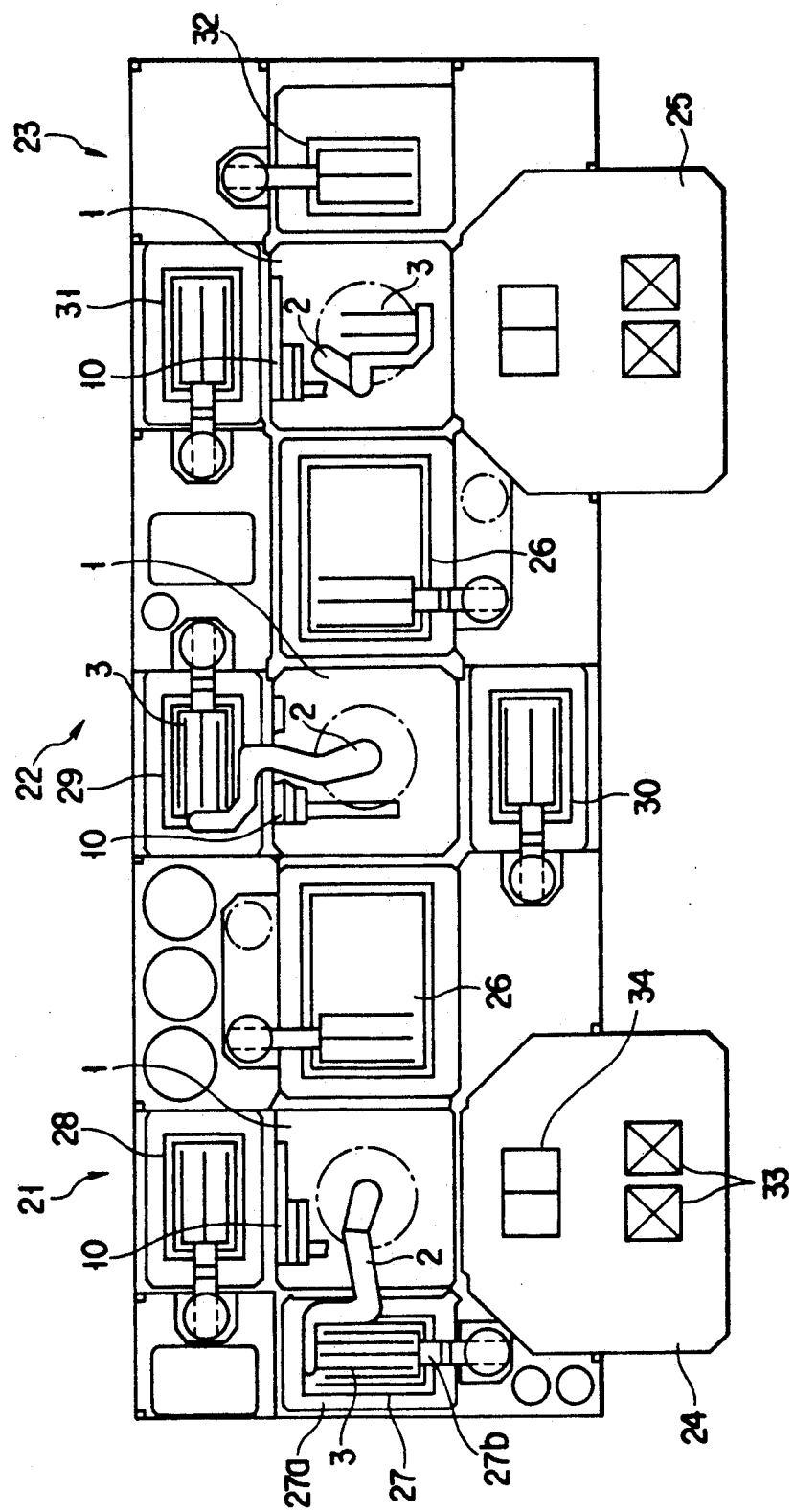
FIG. 1 is a plan view showing an overall arrangement of a cleaning system having a transfer apparatus according to the present invention.

FIG. 1 is a plan view showing the overall layout of a cleaning system incorporating a transfer apparatus according to the present invention.

In this embodiment, the cleaning system is constituted by three cleaning units 21, 22, and 23. A loader 24 is connected to the cleaning unit 21 on the loading side, and an unloader 25 is connected to the cleaning unit 23 on the unloading side. Underwater loaders 26 are also arranged between the cleaning units 21 and 22 and between the cleaning units 22 and 23.

A transfer apparatus having a rotary transfer arm 2 is disposed at the center of the cleaning unit 21 on the loading side. The arm 2 is contained in a housing 1 incorporating a cleaner 10 (to be described later). An ammonia treatment chamber 27 is arranged on the left side of the housing 1 and a washing chamber 28 is arranged in front of the loader 24. In FIG. 1, reference numeral 3 denotes a wafer holding fork mounted on the distal end of the arm 2; and 27a and 27b, a treatment bath and a boat exclusive to the bath.

In the central cleaning unit 22, a housing 1 for accommodating a rotary transfer arm 2 is arranged at the center. The underwater loaders 26 are disposed on the right and left sides of the housing 1. A hydrofluoric acid treatment chamber 29 and a washing overflow treatment chamber 30 are disposed before and behind the housing 1, respectively.

In the cleaning unit 23 on the unloading side, a housing 1 for accommodating a rotary transfer arm 2 is arranged at the center. A washing final rinsing chamber 31 is disposed outside the housing 1 and in front of the unloader 25. A drying chamber 32 is disposed on the right side of the housing 1.

Figure 2:
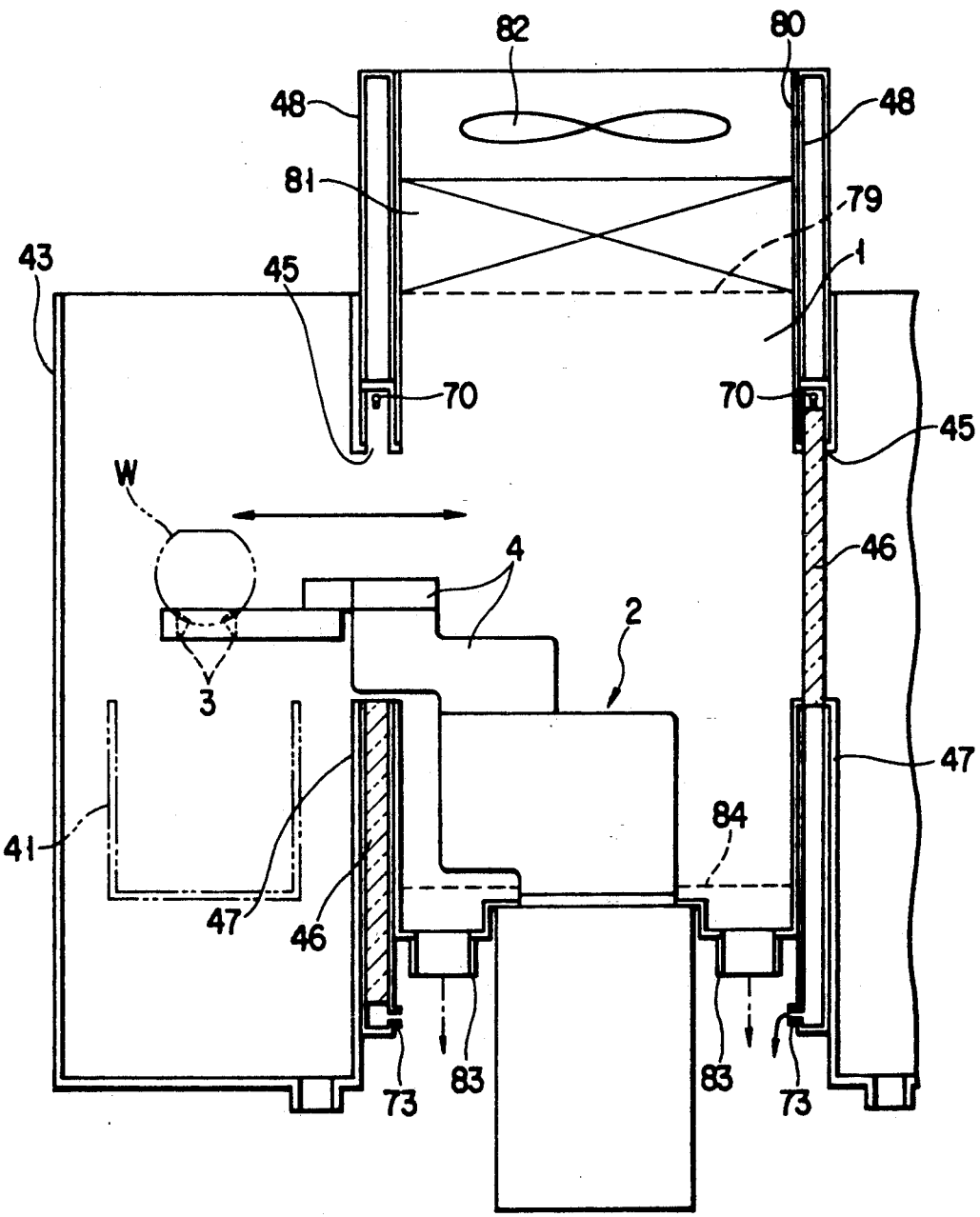
FIG. 2 is a schematic sectional view showing the relationship between a housing of the transfer apparatus and a cleaning chamber.
Figure 3:
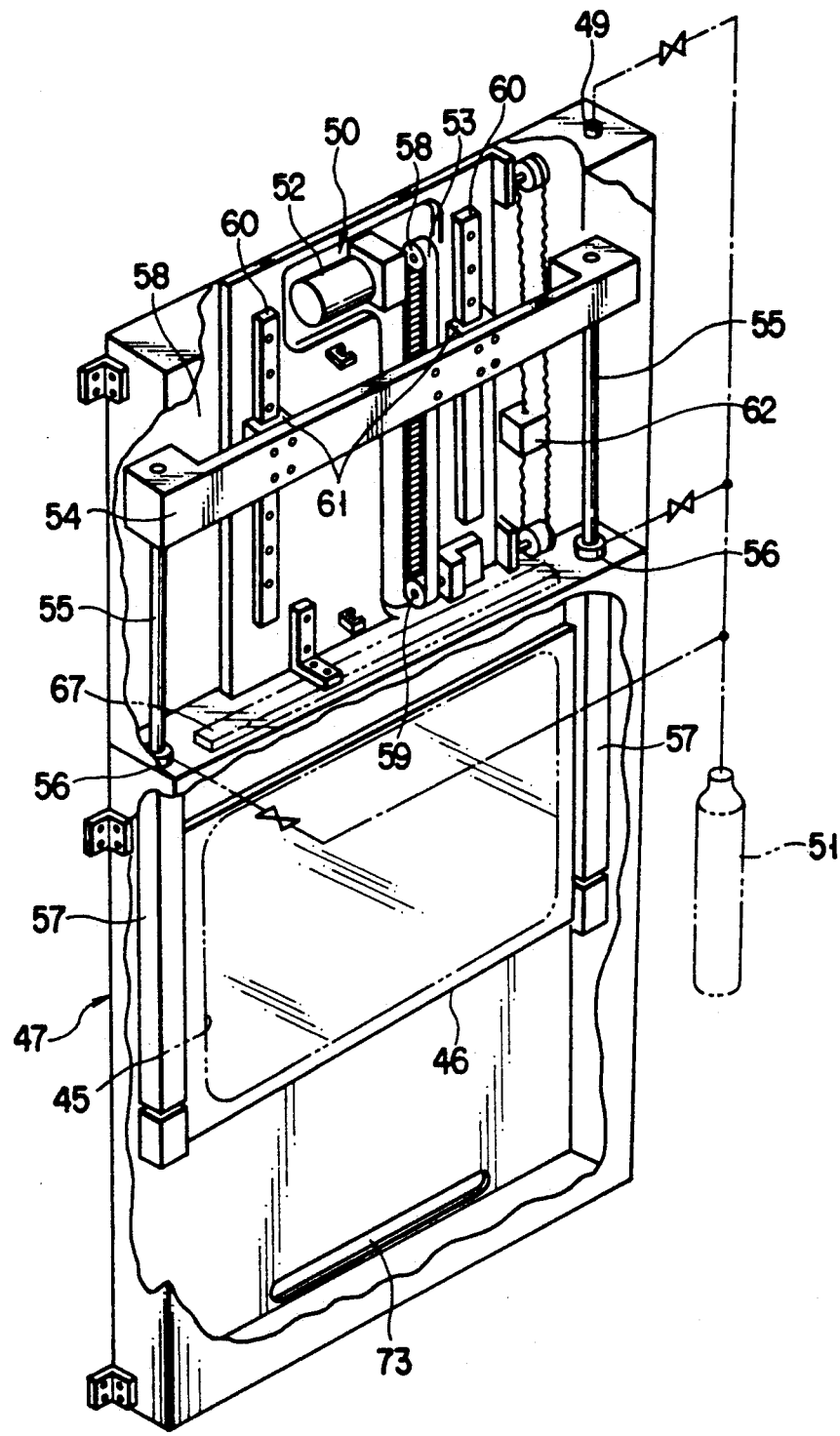
FIG. 3 is a perspective sectional view showing a drive unit of a shutter.

FIG. 2 is a schematic sectional view showing the relationship between a cleaning chamber 43, e.g., the ammonia treatment chamber 27 and the housing 1 for accommodating the transfer arm 2 of the transfer apparatus in the cleaning system of the present invention. In FIG. 2, the cleaner 10 for the rotary transfer arm 2 is omitted for the sake of convenience. FIG. 3 is a sectional perspective view showing an example of a drive unit of a shutter serving as an opening/closing means in the present invention.

An opening portion 45 (FIG. 2) allows the housing 1 to communicate with each treatment chamber 43. A shutter 46 is arranged to be operable in the opening portion 45. An air blowing hole (to be described later) is formed in the upper portion of the opening portion 45 to form an air curtain.

The shutter 46 consists of silica glass having a high chemical resistance or transparent vinyl chloride having a heat resistance. The shutter 46 is disposed to be vertically movable in a rectangular frame-like case 47 having the opening portion 45. A driving means 50 is incorporated in a closed chamber 48 formed contiguously with the upper portion of the case 47. The shutter 46 is activated by the driving means 50 to open or close the opening portion 45. A pressure gas supply hole 49 is formed in the upper end portion of the closed chamber 48. An $N_2$ gas supply source 51 as a pressurizing means is connected to the pressure gas supply hole 49 to constantly maintain the closed chamber 48 in a positive pressure state.

The main part of the driving means 50 is constituted by a motor 52 as a drive source, a timing belt 53 for converting the rotation of the motor 52 into a linear motion, and a movable bar 54 coupled to the timing belt 53 and vertically movable. In the driving means 50 having this arrangement, since the use of the motor 52 makes it possible to set the torque and the speed freely, opening/closing driving can be stably performed.

A pair of vinyl chloride coupling shafts 55 (to be referred to as guide shafts hereinafter) are suspended from the two end portions of the movable bar 54. The opening/closing operation of the shutter 46 is performed via the guide shafts 55. That is, the guide shafts 55 extend through guide shaft receivers 57 arranged on both sides of the opening portion 45, and their lower end portions are coupled with the sides of the shutter 46. The guide shafts 55 are airtightly and slidably inserted in the guide shaft receivers 57 via first sealing mechanisms 56 (to be described later).

The motor 52 is mounted in the upper portion of the closed chamber 48. The timing belt 53 is looped between a driving pulley 58 fitted on the drive shaft of the motor 52 and a driven pulley 59 mounted in the lower portion of the closed chamber 48. Sliders 61 for sliding on a pair of linear rails 60 disposed parallel to the timing belt 53 are fixed on the movable bar 54. A balancer 62 is connected to the movable bar 54 to allow a smooth vertical movement.

Figure 4:
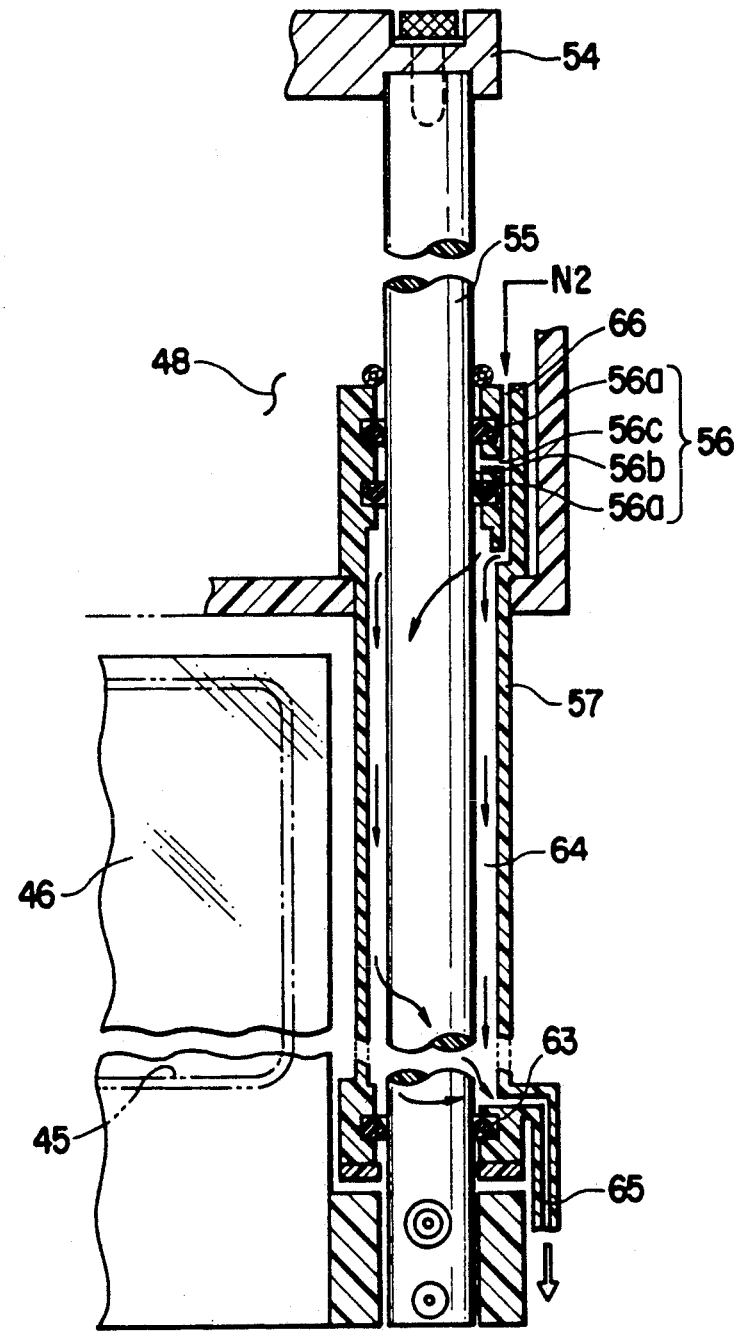
FIG. 4 is a sectional view showing a sealing mechanism of the shutter.

Each guide shaft receiver 57 consists of a vinyl chloride pipe. As shown in FIG. 4, the first sealing mechanism 56 is disposed in the upper portion of the guide shaft receiver 57 on the closed chamber 48 side, and a second sealing mechanism 63 is arranged in its lower end portion located below the opening portion. A sealed space 64 is formed between the two sealing mechanisms. An exhaust hole 65 is formed in the lower end portion of the space 64.

The first sealing mechanism 56 is constituted by two sealing members 56a consisting of synthetic rubber and interposed between the guide shaft 55 and the guide shaft receiver 57. A communication hole 56c which communicates with a space 56b defined between the sealing members 56a is connected to the $N_2$ gas supply source 51 as a pressurizing means through a communication path 66, thereby maintaining the space in a positive pressure state. The second sealing mechanism 63 consists of one synthetic rubber sealing member. The communication path 66 communicates with the sealed space 64 between the first and second sealing mechanisms 56 and 63. Therefore, $N_2$ gas is supplied from the $N_2$ gas supply source to the sealed space 64, and this maintains the space in a positive pressure state. The outer atmosphere or dust adhered to the guide shaft 55 is exhausted from the exhaust hole 65 by the $N_2$ gas.

As shown in FIGS. 5 and 6, a portion 55a of the guide shaft 55, which is exposed below the guide shaft receiver 57 when the shutter 46 is moved down in order to open the opening portion 45, is not moved toward the drive unit beyond the first sealing mechanism 56 when the shutter 46 is moved up in order to close the opening portion 45. This can be confirmed by the movement of a mark 55b formed on the guide shaft 55 (FIGS. 5 and 6). With this arrangement, the exposed portion 55a of the guide shaft 55, to which the outer atmosphere or dust is adhered when the shutter 46 is moved down to expose the portion 55a to the outer atmosphere, is kept located inside the guide shaft receiver 57 when the shutter 46 is closed. Therefore, dust and the like are exhausted from the exhaust hole 65 by $N_2$ gas.

Figure 7:
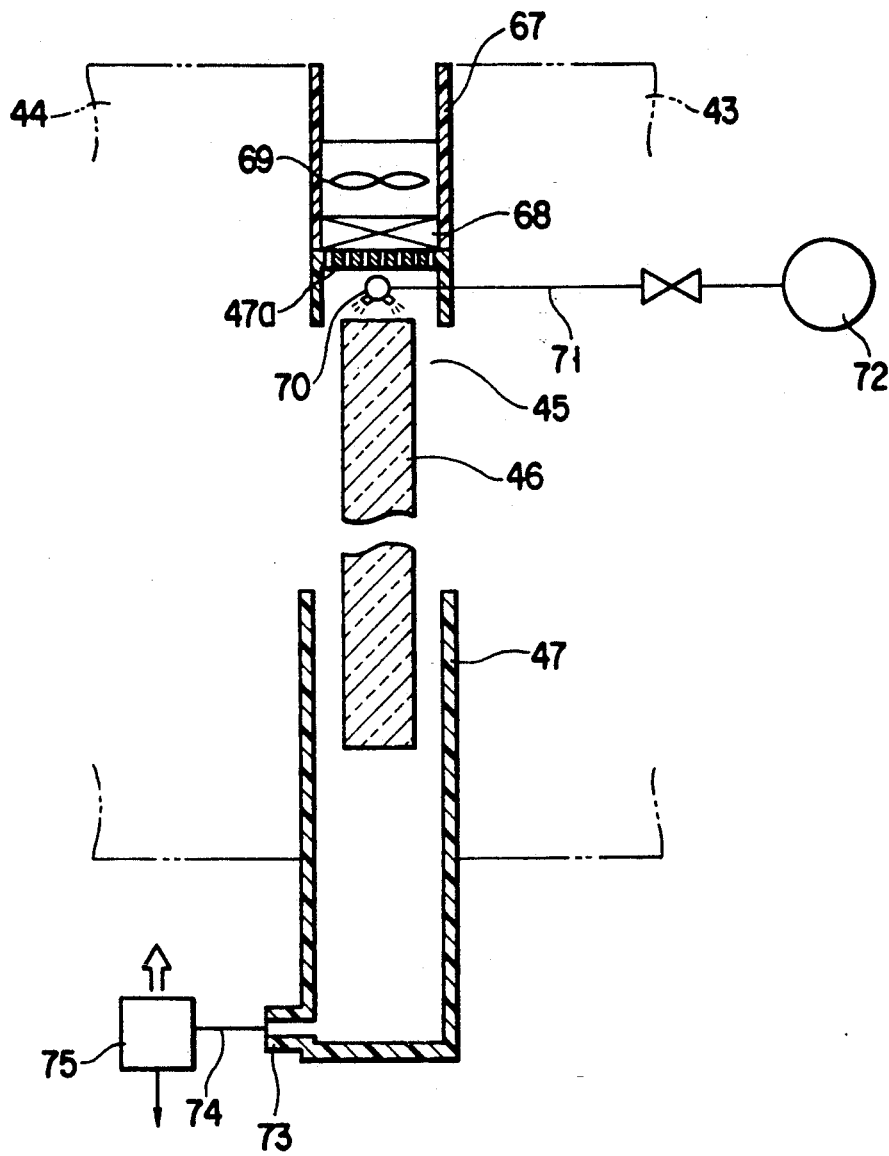
FIG. 7 is an enlarged sectional view showing a shutter mounting portion.

The case 47, on the other hand, consists of a vinyl chloride member having a high water resistance and a high corrosion resistance. An air supply portion 47a in which a plurality of small holes are formed is provided in the upper portion of the case 47 on the sealing chamber 48 side. An air supply fan 49 is disposed in a duct 67 which is connected to the air supply portion 47a via an HEPA filter 68 (FIG. 7). As shown in FIG. 7, a shower nozzle 70 as a shutter cleaning solution supply means is disposed in the upper portion of the case 47. A cleaning solution supply pump 72 is connected to the shower nozzle 70 via a supply pipe 71 to supply pure water as a cleaning solution. The shower nozzle 70 sprays the pure water against the shutter 46 to remove chemicals or impurities adhered to the shutter 46.

An outlet 73 for exhaust and drain is formed in the bottom portion of the case 47. A suction means (not shown) is connected to the outlet 73 via a drain pipe 74. With this arrangement, an air curtain is formed in the case 47 such that purified clean air supplied from the upper portion of the case 47 flows down in the form of a laminar flow and flows out from the outlet 73 formed in the lower portion of the case 47. Therefore, air or the like containing chemicals leaking from the cleaning chamber 43 can be safely exhausted to the outside. A gas-liquid separating unit 75 is disposed midway along the drain pipe 74 to separate the drained cleaning solution and the contaminated air.

A porous plate 79 (FIG. 2) is disposed in an opening formed in the upper end portion of the housing 1, and an HEPA filter 81 and an air supply fan 82 are disposed in a duct 80 connected to the opening. Outlets 83 for exhaust and drain are formed in the bottom portion of the housing 1. A porous plate 84 for straightening the flow of air is arranged above the outlets 83. A suction fan (not shown) is connected to the outlet 83. In the housing 1, purified clean air supplied from the upper portion flows down in the form of a laminar flow and flows out from the outlets 83 formed in the lower portion. Therefore, the atmosphere in the chamber is kept purified. Similarly, the atmosphere in each cleaning chamber is also kept purified by the down flow of clean air.

Transfer of semiconductor wafers W through the opening portion 45 will be described below.

In order to load the wafers W into the cleaning chamber 43, the motor 52 is driven to move the guide shafts 55 and the shutter 46 downward via the timing belt 53 and the movable bar 54, thereby opening the opening portion 45 (FIG. 5). The wafers W are placed on the fork 3 of the rotary transfer arm 2 and transferred into the cleaning chamber 43. During the transfer, clean air is sprayed from the upper portion of the case 47 to form an air curtain and in this manner prevents the outer atmosphere from entering the cleaning chamber 43.

After the wafers W are transferred into the cleaning chamber 43, the rotary transfer arm 2 returns into the housing 1 and waits until cleaning is finished. The wafers W are raised on a boat exclusive to a treatment bath 41, such as the boat 27a (FIG. 1) of the ammonia treatment chamber 27, and dipped in and cleaned by a treatment solution. During the treatment, the motor 52 is driven to move the guide shafts 55 and the shutter 46 upward, thereby closing the opening portion (FIG. 6). This prevents a leakage of the atmosphere from the cleaning chamber 43 to the outside.

The shower nozzle 70 sprays cleaning pure water against the shutter 46. This removes chemicals or impurities adhered to the shutter 46, such as fine particles of a salt produced by a chemical reaction between different atmospheres in the chamber 43 and an adjacent cleaning chamber 43. The waste cleaning solution and the removed chemicals or impurities are drained out from the outlet 73. Therefore, the shutter 46 is constantly maintained in a clean condition to prevent the atmosphere in the cleaning chamber 43 from being disturbed. In addition, the outer atmosphere or dust adhered to the portions 55a of the guide shafts 55, which are exposed to the outer atmosphere upon opening of the shutter 46, is exhausted from the exhaust hole 65 by $N_2$ gas supplied into the sealed space 64. Therefore, the semiconductor wafers W are not contaminated by the outer atmosphere or dust.

Figure 8:
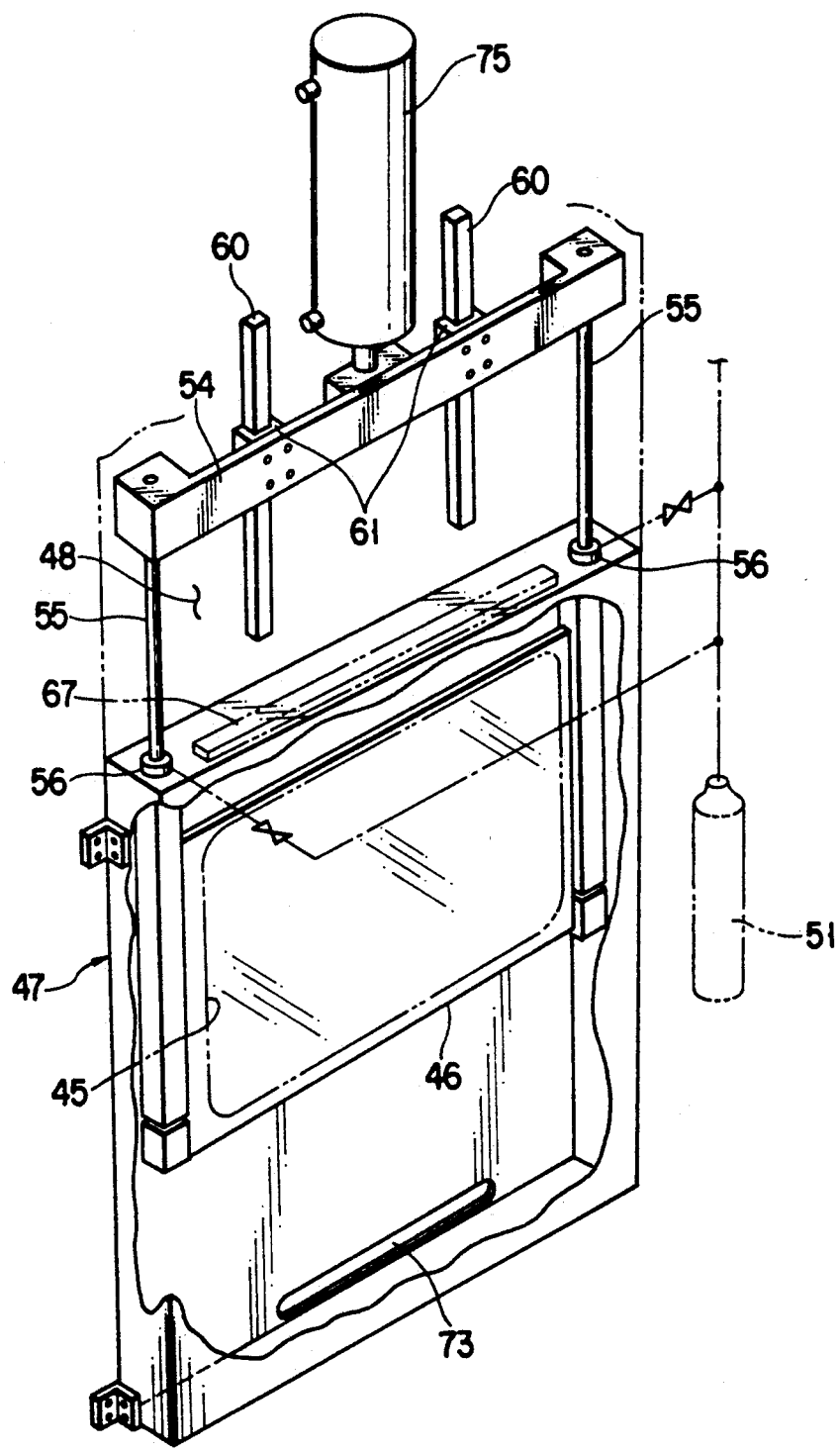
FIG. 8 is a perspective sectional view showing a modification of the drive unit of the shutter.

In the above embodiment, the driving means of the shutter 46 has a structure in which the motor 52 and the timing belt 53 convert a rotation into a linear motion. However, the driving means need not have such a structure. For example, as shown in FIG. 8, if an air cylinder 75 is used to directly move the movable bar 54 vertically, the number of components can be reduced. Note that in FIG. 8, the same reference numerals as in the above embodiment denote the same parts and a detailed description thereof will be omitted.

Figure 9:
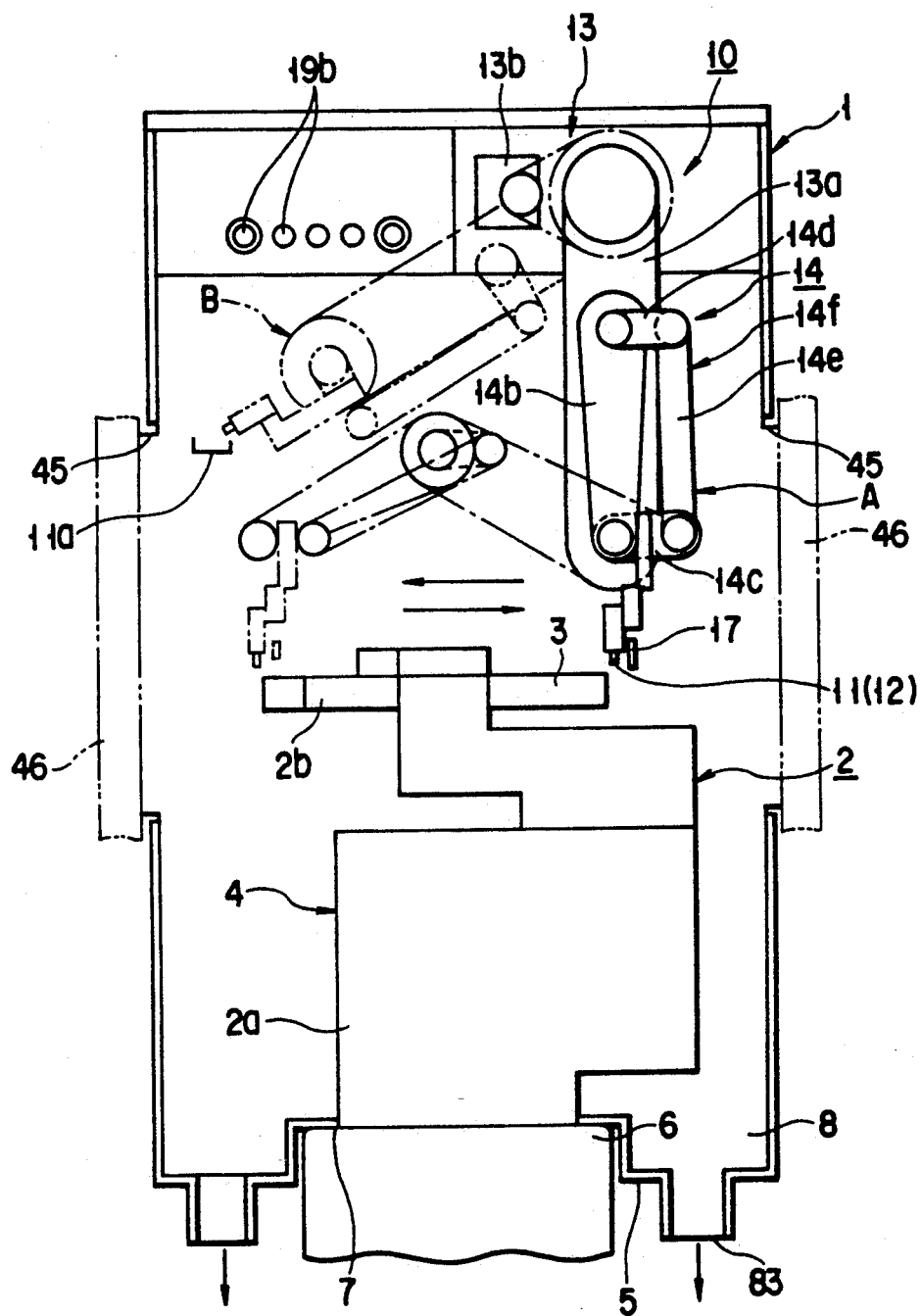
FIG. 9 is a sectional view showing a cleaner in the transfer apparatus.
Figure 10:
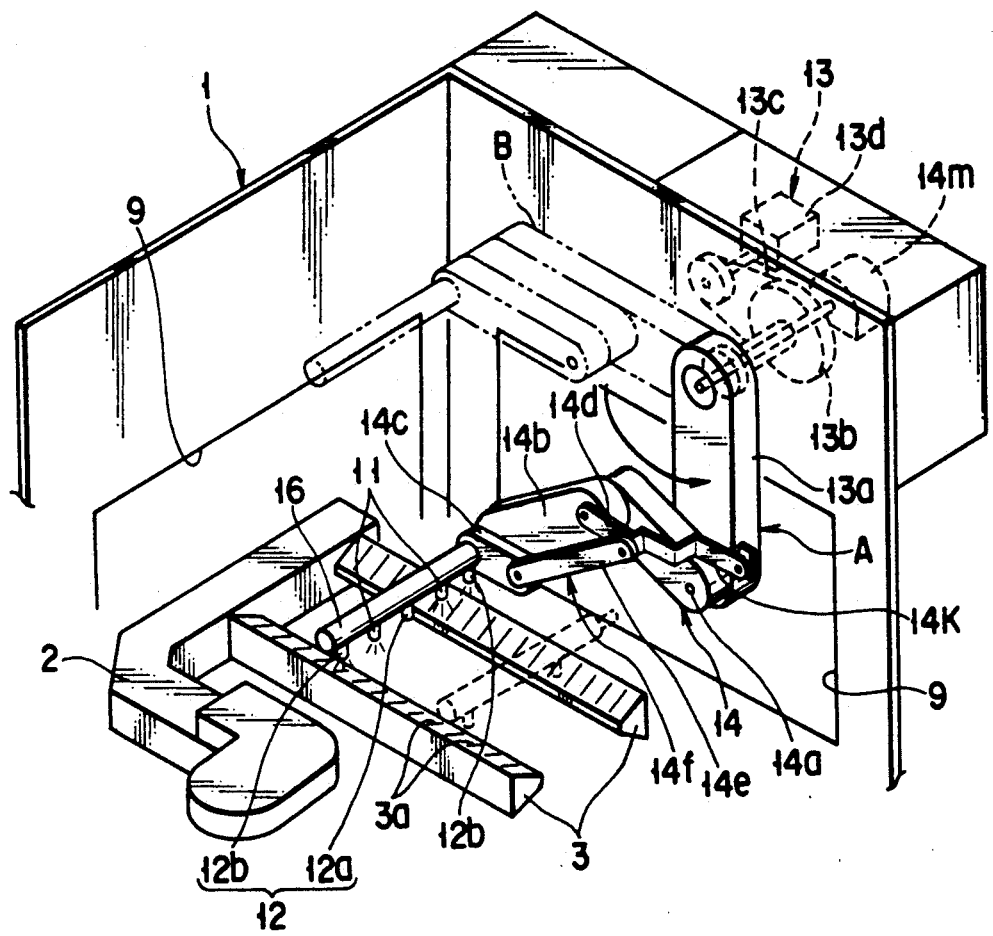
FIG. 10 is a schematic perspective view showing a main part of the cleaner.

FIG. 9 is a view showing the interior of the housing 1 for accommodating the rotary transfer arm 2 of the transfer apparatus, and FIG. 10 is a schematic perspective view showing the main part of the cleaner.

The housing 1 has a watertightness and a corrosion resistance. The cleaner 10 for the rotary transfer arm 2 is mounted in the upper portion of the housing 1. The cleaner 10 has cleaning nozzles 11 for spraying a cleaning solution (pure water) against the fork 3 disposed at the distal end portion of the arm 2 to hold semiconductor wafers, and drying nozzles 12 for spraying a drying gas ($N_2$ gas) against it.

The rotary transfer arm 2 comprises a main body 4 constituted by a base unit 2a and an arm element 2b, and the U-shaped fork 3 mounted on the distal end portion of the arm element 2b in the uppermost portion. The base unit 2a is mounted in a hole 6 formed in the bottom portion 5 of the housing 1 through an O-ring 7. The arm element 2b is mounted to be rotatable and vertically movable on top of the base unit 2a. The fork 3 has grooves 3a for holding a plurality of semiconductor wafers such that the wafers are set upright. The components of the rotary transfer arm 2, i.e., the arm main body 4 and the fork 3 consist of vinyl chloride members having a corrosion resistance.

The housing 1 consists of vinyl chloride having a corrosion resistance as in the rotary transfer arm 2. The bottom portion 5 of the housing 1 is stepped such that the outer peripheral portion is lower than the inner peripheral portion. Two outlets 83 are formed in a circumferential groove 8 of the outer peripheral portion. A waste cleaning solution is drained from these outlets 83. As described above, the opening portion 45 through which wafers are transferred in/out is formed in the side portion of the housing 1, and the shutter 46 is located in this portion.

The cleaner 10 has the cleaning nozzles 11 and the drying nozzles 12. The cleaner 10 also has a position switching means 13 for switching the cleaning and drying nozzles 11 and 12 to a cleaning/drying position A or a standby position B, and a scanning means 14 for transferring the cleaning and drying nozzles 11 and 12 along the fork 3 of the rotary transfer arm 2.

The position switching means 13 has a switch arm 13a which is mounted on the upper side wall of the housing 1 to be pivotal to the vertical position. A position switch motor 13d is coupled to the switch arm 13a via a switch pulley 13b fitted on the pivot shaft of the arm 13a and a switch belt 13c.

The scanning means 14 has an intermediate arm 14a which is pivotally mounted on the distal end portion of the switch arm 13a. A leading arm 14b is pivotally mounted on the distal end portion of the arm 14a. A plate 14c for mounting the cleaning and drying nozzles 11 and 12 is pivotally mounted on the distal end portion of the leading arm 14b. A short link 14d is pivotally mounted on the pivot shaft of the leading arm 14b so as to be parallel to the mounting plate 14c. A coupling link 14e is pivotally mounted on the distal end portion of the short link 14d and on the distal end portion of the plate 14c. As a result, a four-node rotational chain link mechanism 14f is constituted in the scanning means 14.

Figure 11:
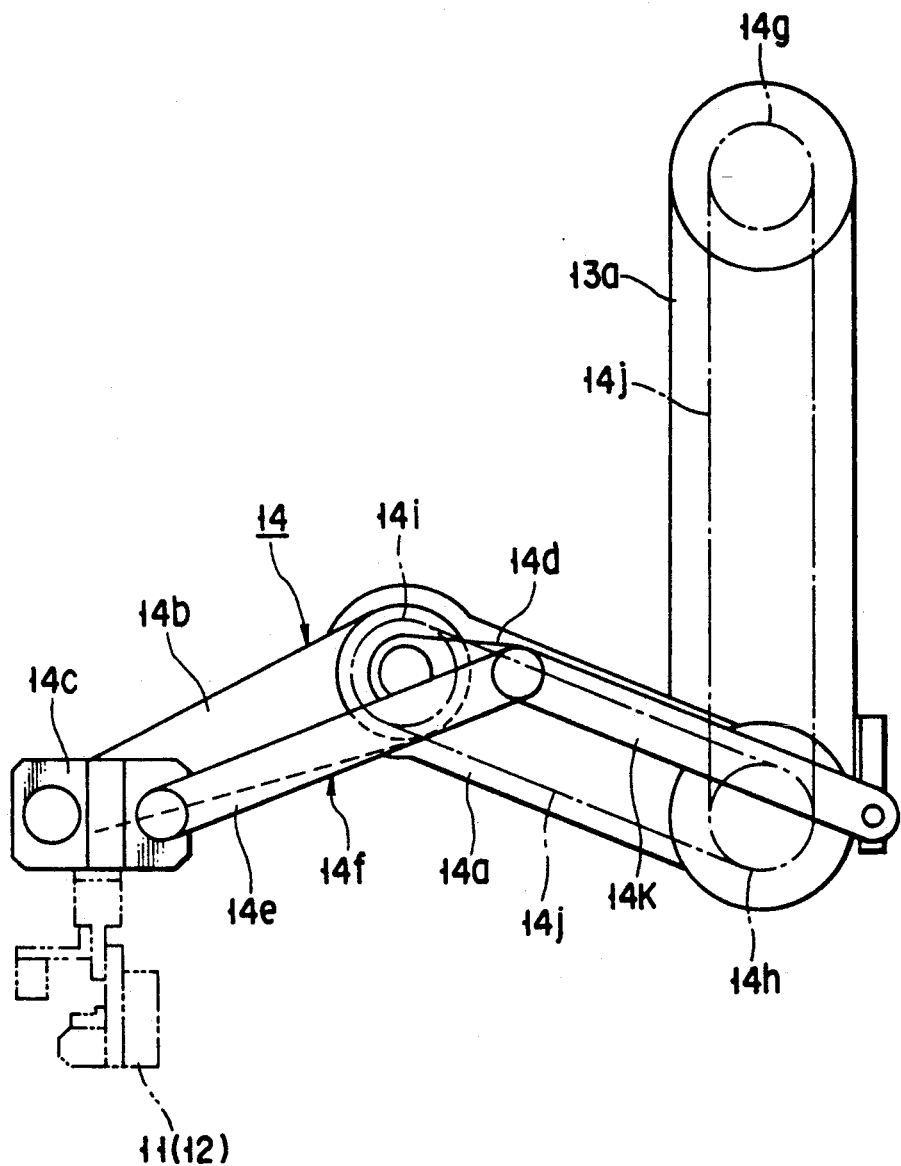
FIG. 11 is a schematic side view showing one operating condition of the cleaner.

As shown in FIGS. 11 and 12, a timing belt 14j is looped between a driving pulley 14g mounted on the pivot shaft of the switch arm 13a and an intermediate pulley 14h rotatably fitted on the pivot shaft of the intermediate arm 14a. The other timing belt 14j is looped between the intermediate pulley 14h and a fixed pulley 14i mounted on the pivot shaft of the leading arm 14b so as to be integrated with the leading arm 14b. One end of a rocking link 14k is pivotally mounted on the side of the distal end portion of the switch arm 13a, and the other end of the rocking link 14k is pivotally mounted on the pivot shaft of the short link 14d and the coupling link 14e. Therefore, when the driving pulley 14g is driven by a motor 14m for a scanning movement, the cleaning and drying nozzles 11 and 12 mounted on the plate 14c can be moved along the fork 3 of the rotary transfer arm 2.

Figure 13:
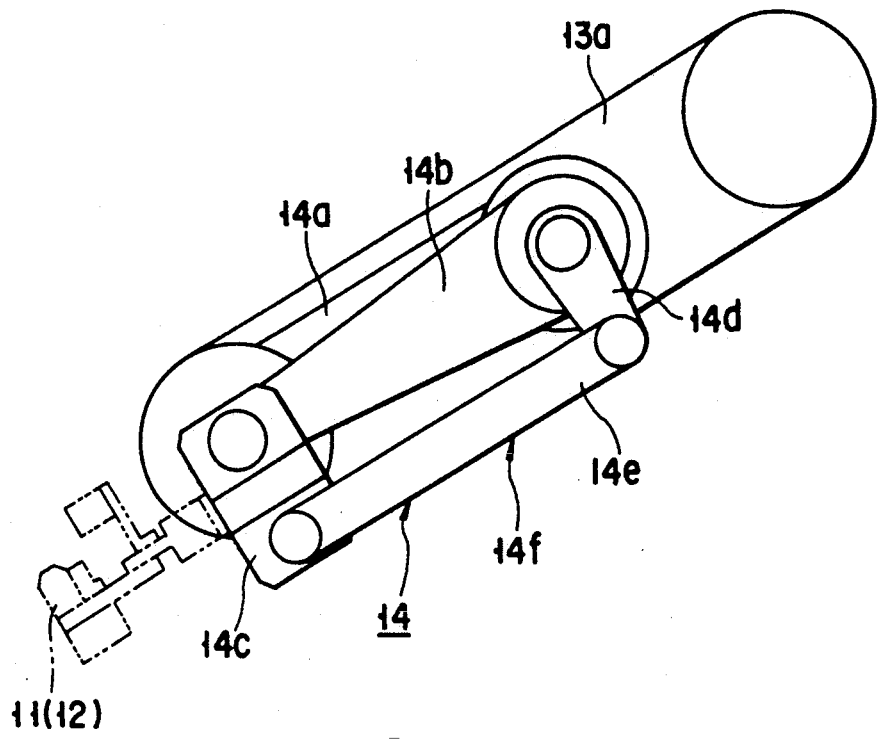
FIG. 13 is a schematic side view showing a standby condition of the cleaner.

When the switch motor 13d is driven in the standby position B shown in FIG. 13, the switch arm 13a is pivoted to the vertical or the cleaning/drying position A. When the scanning movement motor 14m is driven in this state, the driving pulley 14g is rotated, and this causes the intermediate arm 14a and the leading arm 14b to pivot via the timing belts 14j. At the same time, the link mechanism 14f and the rocking link 14k cooperate to convert the pivotal motion into a linear motion, thereby moving the cleaning and drying nozzles 11 and 12 mounted on the plate 14c parallel to the fork 3 of the rotary transfer arm 2 (FIGS. 11 and 12). This scanning movement is reciprocated by reversing the rotating direction of the motor 14m. In order to return the switch arm 13a to the standby position B after the cleaning and drying, the switch arm 13a need only be pivoted to the standby position B with the arm 13a, the intermediate arm 14a, and the leading arm 14b overlapped in line (FIG. 13).

The switch arm 13a, the intermediate arm 14a, and the leading arm 14b consist of stainless steel members. A sealing member (not shown), such as a packing, is interposed in each coupled portion between the arms to keep airtightness.

Figure 14:
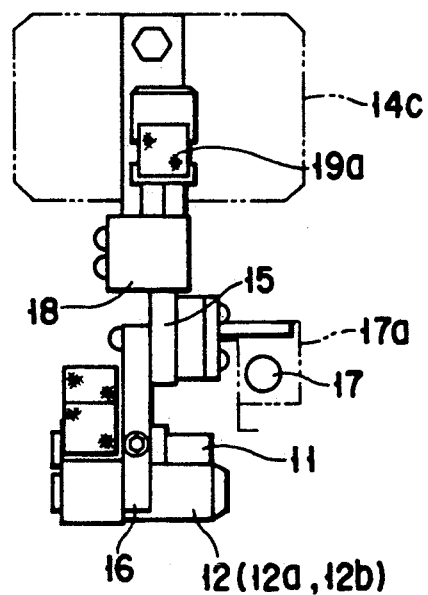
FIG. 14 is a side view showing cleaning and drying nozzles of the cleaner and its heating means for drying.
Figure 15:
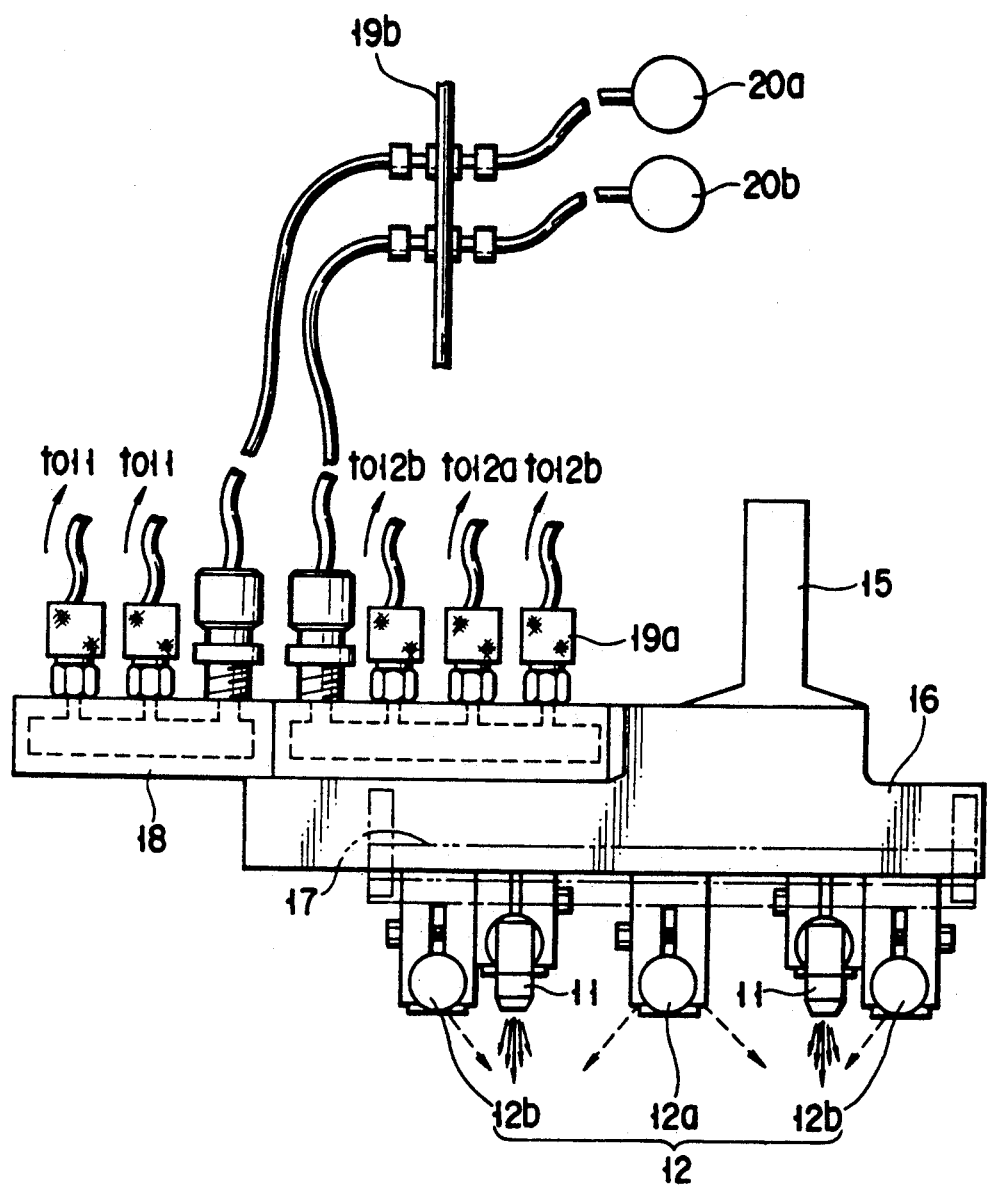
FIG. 15 is a front view showing the cleaning and drying nozzles of the cleaner and its heating means for drying.

As shown in FIGS. 14 and 15, the cleaning and drying nozzles 11 and 12 are mounted on a nozzle block 16 which is fixed on a bracket 15 coupled to the mounting plate 14c. A central drying nozzle body 12a is mounted on the central position of the lower surface of the nozzle block 16. The cleaning nozzles 11 are mounted on both sides of the central drying nozzle body 12a, and outer drying nozzle bodies 12b are mounted outside the cleaning nozzles 11. It is possible to adjust the directions of nozzle holes of these cleaning and drying nozzles 11 and 12 arranged as described above. In addition, the cleaning nozzles 11 and the outer drying nozzle bodies 12b are mounted such that their positions can be adjusted with respect to the horizontal direction.

Figure 16:
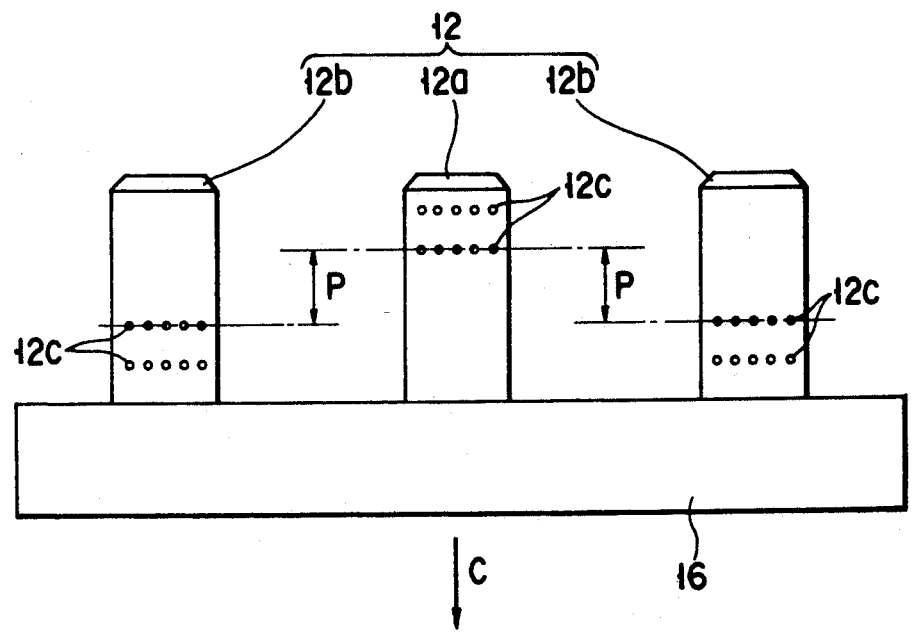
FIG. 16 is a schematic bottom view showing the drying nozzles of the cleaner.

The cleaning nozzles 11 and the outer drying nozzle bodies 12b are arranged on both sides of the central drying nozzle body 12a in order to clean and dry the entire U-shaped fork 3 at one time. Arrays of nozzle holes 12c of the central drying nozzle body 12a and arrays of nozzle holes 12c of each outer drying nozzle body 12b are formed with a predetermined interval between them in the direction of movement. As shown in FIG. 16, this interval is equal to a pitch P (FIG. 17) between the wafer holding grooves 3a formed in the fork 3. The interval between two arrays of the nozzle holes 12c of each of the nozzle bodies 12a and 12b is set narrower than the pitch P. The nozzle holes 12c of the outer drying nozzle bodies 12b spray a drying gas toward the opening portions on the upper end side of the grooves 3a of the fork 3, whereas the nozzle holes 12c of the central drying nozzle body 12a spray the drying gas toward the opening portions on the lower end side of the grooves 3a (FIG. 18).

When, therefore, the cleaning and drying nozzles 11 and 12 are moved in a direction indicated by an arrow C shown in FIG. 16 to perform drying, a drying gas sprayed from the outer drying nozzle bodies 12b is first blown against the opening portions on the upper end side of the grooves 3a to flow any solution droplets or dust adhered to the grooves 3a down to the opening portions on the lower end side (an arrow F shown in FIG. 18). Thereafter, a drying gas sprayed from the central drying nozzle body 12a flows the droplets or dust flown to the opening portions on the lower end side of the grooves 3a down to the lower surface of the fork 3 (an arrow G shown in FIG. 18). Therefore, it is possible to efficiently remove chemicals or dust adhered to the fork 3 and to satisfactorily dry it. When the lower end portion of the fork 3 is cut to have an acute angle, droplets flowing on the lower surface of the fork 3 do not drop into the bottom portion 5 of the housing 1. The cleaning nozzles 11, the central drying nozzle body 12a, and the outer drying nozzle bodies 12b consist of members having a corrosion resistance, e.g., vinyl chloride members.

An infrared lamp 17 (FIG. 14) as a heating means for drying is mounted on the side surface of the bracket 15 for holding the nozzle block 16. The infrared lamp 17 is disposed in a reflecting case 17a fixed to the bracket 15 and promotes drying of the fork 3 by radiating infrared rays on it.

A manifold 18 for piping and wiring is disposed above the nozzle block 16. Nozzle connectors 19a provided on the manifold 18 are connected via flexible tubes to connectors 19b (FIG. 9) provided on the upper side wall of the housing 1. This makes it possible to supply a cleaning solution (e.g., non-ionized pure water) and a drying gas (e.g., nitrogen or purified dry air) from a cleaning solution supply source 20a and a drying gas supply source 20b to the cleaning and drying nozzles 11 and 12.

The operation of the cleaner 10 will be described below.

In order to clean the fork 3 of the rotary transfer arm 2, the switch motor 13d is driven to pivot the switch arm 13a to the vertical position as indicated by solid lines in FIG. 9. The motor 14m is driven to move the cleaning nozzles 11 along the fork 3. At the same time, pure water for cleaning is supplied from the cleaning solution supply source and sprayed from the nozzle holes of the cleaning nozzles 11 against the entire surface of the fork 3, thereby removing most of chemicals or impurities adhered to the fork 3.

When the cleaning is finished in this manner, supply of the cleaning solution from the cleaning solution supply source is stopped. The motor 14m is rotated in the reverse direction to move the drying nozzles 12 along the fork 3. During the movement, $N_2$ gas for drying is supplied from the drying gas supply source and sprayed from the nozzle holes 12c of the drying nozzles 12 against the entire surface of the fork 3. In addition, the infrared lamp 17 radiates infrared rays onto the fork 3. As a result, it is possible to dry the fork 3 by perfectly removing solution droplets adhered to the fork 3 upon cleaning, or chemicals or dust which cannot be removed from the fork 3 by cleaning.

The rotary transfer arm 2, therefore, can always be used in transfer of semiconductor wafers in a clean condition. After the cleaning and drying, the switch arm 13a, the intermediate arm 14a, and the leading arm 14b are overlapped in line. The switch motor 13d is rotated in the reverse direction to pivot the switch arm 13a to the standby position B. As a result, the cleaning and drying nozzles 11 and 12 are moved to the upper side portion of the housing 1 and in this manner retracted in the standby position at which they do not interfere with loading/unloading of semiconductor wafers.

A gutter-like droplet receiver 11a is provided on one side of the switch arm 13a. When the cleaning and drying nozzles 11 and 12 are moved to the standby position, droplets of pure water dropping from the cleaning nozzles 11 are received by the droplet receiver 11a.

The flow of semiconductor wafers in the overall cleaning system incorporating the transfer apparatus of the present invention will be described below with reference to FIG. 1.

In the cleaning system shown in FIG. 1, two carriers 33 each mounting 25 wafers are transferred to the loader 24. Orientation flat aligners 34 align the wafers in the carriers 33, and push rods (not shown) are moved upward to push up the wafers from the carriers 33. The push rods move closer to each other to arrange the 50 wafers with equal intervals between them.

The rotary transfer arm 2 pivots horizontally and extends toward the loader 24 to locate the fork 3 at its distal end below the push rods. The push rods move down to place the wafers on the fork 3.

The rotary transfer arm 2 pivots horizontally with the wafers placed on the fork 3 and contracts to insert the wafers through the opening portion of the ammonia treatment chamber 27 and place them on the boat 27b exclusive to the treatment bath 27a of the ammonia treatment chamber 27. When the rotary transfer arm 2 moves outside the ammonia treatment chamber 27, the shutter 46 of the opening portion 45 is closed. At the same time, air is sprayed from the air spray holes formed in the upper portion of the opening portion to form an air curtain. This prevents the atmosphere in the ammonia treatment chamber 27 from leaking out of the chamber. In this condition, the wafers in the ammonia treatment chamber 27 are cleaned.

When the fork 3 of the rotary transfer arm 2 returns from the ammonia treatment chamber 27 to inside the housing 1, the switch motor 13d of the cleaner 10 is driven to move the cleaning and drying nozzles 11 and 12 to a position above the fork 3. Thereafter, the scanning movement motor 14m is driven to move the cleaning and drying nozzles 11 and 12 along the fork 3. During the movement, pure water is supplied from the cleaning solution supply source and sprayed from the cleaning nozzles 11 against the entire surface of the fork 3, thereby removing ammonia and other impurities adhered to the fork 3. Droplets of the pure water used in cleaning are collected in the bottom portion 5 of the housing 1 and drained out from the outlets 83. After the cleaning is performed in this manner for a predetermined period of time, supply of the pure water from the cleaning solution supply source is stopped. Thereafter, the scanning movement motor 14m is rotated in the reverse direction to move the cleaning and drying nozzles 11 and 12 along the fork 3. At the same time, $N_2$ gas is supplied from the drying gas supply source and sprayed from the nozzle holes 12c of the drying nozzles 12 against the entire surface of the fork 3, thereby drying the fork 3 wetted by the cleaning and removing droplets or dust adhered to the fork 3. After the drying, the switch arm 13a, the intermediate arm 14a, and the leading arm 14b are overlapped in line, and the switch motor 13d rotates in the reverse direction to return the cleaner 10 to the standby position. The cleaning and drying of the fork 3 are performed while the fork 3 waits until a treatment time (about 10 minutes) in the ammonia treatment chamber 27 is up.

When the cleaning in the ammonia treatment chamber 27 is finished, an operation reverse to the above operation is performed such that the wafers on the boat 27b are placed on the fork 3 of the rotary transfer arm 2, removed from the ammonia treatment chamber 27, and transferred into the next washing chamber 28. Thereafter, the fork 3 of the rotary transfer arm 2 returned from the washing chamber 28 is cleaned and dried by the cleaner 10 in the same manner as described above to make it possible to transfer next 50 wafers. Since, therefore, the rotary transfer arm 2 is cleaned and dried during its standby condition after transfer of wafers, the cleaning of wafers can be continuously and efficiently performed. In addition, since the rotary transfer arm 2 is disposed in the housing 1 having a watertightness and a corrosion resistance, a waste solution used in cleaning of the rotary transfer arm 2 is not scattered to the outside but safely drained.

The wafers cleaned by the cleaning unit 21 on the loading side are transferred to the central cleaning unit 22 by the underwater loader 26 located between the cleaning unit 21 on the loading side and the central cleaning unit 22. The wafers are transferred in the same manner as described above by the rotary transfer arm 2 disposed in the housing 1 of the central cleaning unit 22. In this unit 22, the wafers are sequentially subjected to cleaning performed in the hydrofluoric acid treatment chamber 29 and a washing overflow treatment performed in the overflow treatment chamber 30. Also in the cleaning performed by this intermediate cleaning unit, the fork 3 of the rotary transfer arm 2 standing by in the housing 1 is cleaned and dried as described above.

The wafers cleaned by the central cleaning unit 22 are transferred to the cleaning unit 23 on the unloading side by the underwater loader 26 located between the central cleaning unit 22 and the cleaning unit 23 on the unloading side. The wafers are transferred by the rotary transfer arm 2 of the cleaning unit 23 on the unloading side in the same manner as described above, subjected to final rinsing, and dried. Also in the cleaning performed by this cleaning unit 23 on the unloading side, the fork 3 of the rotary transfer arm 2 is cleaned and dried by the cleaner 10 as described above and in this manner used in transfer of wafers always in a clean condition.

The wafers cleaned by the cleaning unit 23 on the unloading side are transferred to the unloader 25. The unloader 25 divides these wafers into two groups of 25 wafers each and performs orientation flat alignment for them. The two wafer groups are placed on two carriers and unloaded.

In the above embodiment, the cleaning system is used in treatments of semiconductor wafers. The cleaning system, however, can also be used in treatments of, e.g., LCD glass substrates. In addition, the transfer apparatus according to the present invention can be applied not only to the cleaning system but also to a wet-etching system, a treatment system having another corrosive gas atmosphere, or a clean transfer system.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An apparatus for transferring a plurality of wafer-like objects to be treated, comprising:

a housing for defining a closed space;

an opening portion formed in said housing;

a transfer arm disposed in said housing, said arm comprising a movable portion capable of extending out from said housing through said opening portion;

a holding portion, disposed in said movable portion of said arm, for holding the objects to be treated, said holding portion having a plurality of holding grooves for arranging the objects to be treated with predetermined intervals therebetween;

opening/closing means for airtightly opening/closing said opening portion;

cleaning means, disposed in said housing, for spraying a cleaning solution against said holding portion;

drying means, disposed in said housing, for spraying a drying gas against said holding portion;

a support member for supporting said cleaning means and said drying means;

position switching means for moving said support member between an operation position and a standby position; and moving means for moving said support member along said holding portion in a direction perpendicular to said holding grooves.

2. An apparatus according to claim 1, wherein said position switching means performs position switching by pivoting said support member.

3. An apparatus according to claim 1, wherein said drying means comprises a pair of nozzle holes arranged at positions on both sides of said holding portion, said pair of nozzle holes being directed toward both end portions of each holding groove.

4. An apparatus according to claim 1, wherein said holding portion comprises a pair of rod members, having said holding grooves, for holding two sides of lower portions of the wafer-like objects to be treated, each of said rod members having a substantially triangular sectional shape, and said holding grooves being formed along one side of the triangle.

5. An apparatus according to claim 4, wherein said drying means comprises two pairs of nozzle holes arranged at positions on both sides of each rod member, each pair of nozzle holes being directed toward both end portions of each holding groove.

6. An apparatus according to claim 1, wherein said position switching means and said moving means include respective drive sources attached to said housing, and said support member is connected to said drive sources through respective shafts coaxially arranged.

7. An apparatus according to claim 1, wherein an infrared lamp for heating said holding portion is disposed in said support member.

* * * * *